(12) United States Patent
Gion

(10) Patent No.: US 11,894,843 B2
(45) Date of Patent: Feb. 6, 2024

(54) LEVEL SHIFT CIRCUIT

(71) Applicant: Socionext Inc., Kanagawa (JP)

(72) Inventor: Masahiro Gion, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/959,810

(22) Filed: Oct. 4, 2022

(65) Prior Publication Data

US 2023/0132469 A1  May 4, 2023

(30) Foreign Application Priority Data

Oct. 29, 2021 (WO) .................. PCT/JP2021/039969

(51) Int. Cl.
*H03K 19/01* (2006.01)
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC ........... H03K 19/018521; H03K 3/037; H03K 5/003; H03K 19/0175; G06F 3/00; G06F 3/1295
USPC ....................................................... 327/333
See application file for complete search history.

(56) References Cited

U.S. PATENT DOCUMENTS

| | | | |
|---|---|---|---|
| 5,528,173 A | 6/1996 | Merritt et al. | |
| 5,543,744 A * | 8/1996 | Okumura | H03K 19/01707 326/62 |
| 5,659,258 A | 8/1997 | Tanabe et al. | |
| 5,666,070 A | 9/1997 | Merritt et al. | |
| 5,698,993 A * | 12/1997 | Chow | H03K 3/356113 326/17 |
| 5,781,026 A * | 7/1998 | Chow | H03K 3/356147 326/26 |

(Continued)

FOREIGN PATENT DOCUMENTS

| | | |
|---|---|---|
| JP | H06-204850 A | 7/1994 |
| JP | H07-202650 A | 8/1995 |

(Continued)

OTHER PUBLICATIONS

International Search Report (ISR) dated Nov. 30, 2021 issued in International Patent Application No. PCT/JP2021/039969.

*Primary Examiner* — Quan Tra
*Assistant Examiner* — Anh-Quan Tra
(74) *Attorney, Agent, or Firm* — Rimon, P.C.

(57) ABSTRACT

A level shift circuit includes first to fourth n-type transistors, first and second p-type transistors, and first and second inverters. The first n-type transistor receives an input signal at its gate and has a drain connected to an inverted output node. The first p-type transistor is placed between a third power supply and the inverted output node. The second n-type transistor receives an inverted input signal at its gate and has a drain connected to an output node. The second p-type transistor is placed between the third power supply and the output node. The third n-type transistor is between the inverted output node and an inverted input node, and the first inverter between the drain and gate of the third n-type transistor. The fourth n-type transistor is between the output node and an input node, and the second inverter between the drain and gate of the fourth n-type transistor.

10 Claims, 9 Drawing Sheets

(56) References Cited

U.S. PATENT DOCUMENTS

| | | | |
|---|---|---|---|
| 5,852,371 A | 12/1998 | Merritt et al. | |
| 5,936,428 A | 8/1999 | Merritt et al. | |
| 6,011,421 A | 1/2000 | Jung | |
| 6,060,904 A | 5/2000 | Shimoda | |
| 6,191,616 B1 | 2/2001 | Merritt et al. | |
| 6,344,764 B2 * | 2/2002 | Tanzawa | G11C 8/08 327/333 |
| 2001/0000654 A1 | 5/2001 | Merritt et al. | |
| 2002/0175706 A1 | 11/2002 | Kouzuma | |
| 2019/0058475 A1 | 2/2019 | Chen et al. | |

FOREIGN PATENT DOCUMENTS

| | | | |
|---|---|---|---|
| JP | H09-223956 A | 8/1997 | |
| JP | H10-190438 A | 7/1998 | |
| JP | H11-145820 A | 8/1999 | |
| JP | 2000-244307 A | 9/2000 | |
| JP | 2002-353804 A | 12/2002 | |
| JP | 2009-027600 A | 2/2009 | |
| JP | 2012-170034 A | 9/2012 | |
| WO | WO-2023073904 A1 * | 5/2023 | ..... H03K 19/018521 |

* cited by examiner

LEVEL SHIFT CIRCUIT

CROSS-REFERENCE TO RELATED APPLICATIONS

This application claims priority to International Application No. PCT/JP2021/039969 filed on Oct. 29, 2021. The entire disclosure of this application is incorporated by reference herein.

BACKGROUND

The present disclosure relates to a level shift circuit that converts the potential of a signal, which is required when the signal is passed between circuits to which different power supply voltages are supplied.

A level shift circuit is provided in an interface part in which a signal is passed from a relatively low-voltage circuit inside a semiconductor chip to a relatively high-voltage circuit outside the semiconductor chip, for example, and used at the time of conversion of the potential of the signal.

For example, Japanese Unexamined Patent Publication No. H07-202650 describes a level shift circuit that generates an output signal of a desired level depending on the level of an input signal and supplies the signal to a next-stage semiconductor device.

Specifically, in FIG. 1 of the cited patent document, when the initial state is Φ21=L, the node N23=H (Vcc). Therefore, the transistor 31 is OFF, the transistor 33 is ON, the nodes N32, N25=L, and the transistor 42 is OFF. Also, since the node N24=L, the transistor 41 is ON, the transistor 43 is OFF, the nodes N42, N26=H (Vpp), and the transistor 32 is ON.

Once Φ21 transitions from L to H, the transistor 31 turns ON and the transistor 33 turns OFF, whereby Vcc and the nodes N32 and N25 are connected through the transistors 31 and 32, causing the node N25 to rise. In this way, the level shift operation is assisted in the level shift circuit of the cited patent document.

In FIG. 1 of the cited patent document, however, when Φ21 transitions from L to H, causing the node N23 to become L, the node N24 becomes H (Vcc), whereby the transistor 43 turns ON and the nodes N42 and N26 changes from H (Vpp) to L. This turns OFF the transistor 32, shutting off the connection between Vcc and the nodes N25 and N32 through the transistors 31 and 32. As a result, as shown by the dashed-line circle in FIG. 6, the assist operation of the level shift is discontinued midway through the rising of the signal to Vcc, and this may end up in insufficient speedup.

Also, in the initial state described above in FIG. 1 of the cited patent document, since the transistor 41 is ON and the transistor 42 is OFF, the node between the transistor 41 and the transistor 42 is Vcc. When Φ21 transitions from L to H in this state, the node N24 transitions from L to H (Vcc), whereby the transistor 41 turns OFF and the transistor 43 turns ON. Since the transistor 42 maintains the OFF state, the node between the transistor 41 and the transistor 42 is boosted from Vcc due to a gate-drain coupling capacitance of the transistor 41. This causes a problem that a stress is applied across the source-drain of the transistor 42. Such a voltage stress was not a so large problem in conventional transistors, but with the recent miniaturization of the manufacturing processes, has become a problem required to be cared for.

An objective of the present disclosure is providing a level shift circuit in which the effectiveness of the assist operation is further enhanced and the voltage stress to transistors is eased.

SUMMARY

According to one mode of the present disclosure, a level shift circuit includes: an input node receiving an input signal transitioning between a first power supply and a second power supply lower in potential than the first power supply; an inverted input node receiving an inverted input signal inverted from the input signal; a first n-type transistor having a gate connected to the input node, a source connected to the second power supply or the inverted input node, and a drain connected to an inverted output node; a first p-type transistor having a drain connected to the inverted output node, a source connected to a third power supply higher in potential than the first power supply, and a gate connected to an output node; a second n-type transistor having a gate connected to the inverted input node, a source connected to the second power supply or the input node, and a drain connected to the output node; a second p-type transistor having a drain connected to the output node, a source connected to the third power supply, and a gate connected to the inverted output node; a third n-type transistor having a source connected to the inverted input node and a drain connected to the inverted output node; a first inverter having an input connected to the inverted output node and an output connected to a gate of the third n-type transistor; a fourth n-type transistor having a source connected to the input node and a drain connected to the output node; and a second inverter having an input connected to the output node and an output connected to a gate of the fourth n-type transistor.

In the level shift circuit of the above mode, in the third transistor that switches ON/OFF of charge supply, the assist operation is turned OFF after a lapse of a predetermined delay time of the first inverter from the change of the inverted output signal. Similarly, in the fourth transistor that switches ON/OFF of charge supply, the assist operation is turned OFF after a lapse of a predetermined delay time of the second inverter from the change of the output signal. Therefore, in comparison with the prior art, since a sufficient assist operation time can be secured, the effectiveness of the assist operation can be further enhanced.

Moreover, in the technique of the cited patent document, in FIG. 1 of this document, when the node N24 becomes H, both the transistors 41 and 42 are OFF, causing a problem of boosting the voltage at the node between the transistor 41 and the transistor 42. By contrast, according to this mode, there is no such place where transistors on both sides of a given node become OFF simultaneously, causing a floating state, in the process of the assist operation. Therefore, no problem about boosting of the voltage at a given node will occur.

According to the present disclosure, in a level shift circuit, the effectiveness of the assist operation can be further enhanced, and the voltage stress to transistors can be eased.

DETAILED DESCRIPTION

Figure 1:
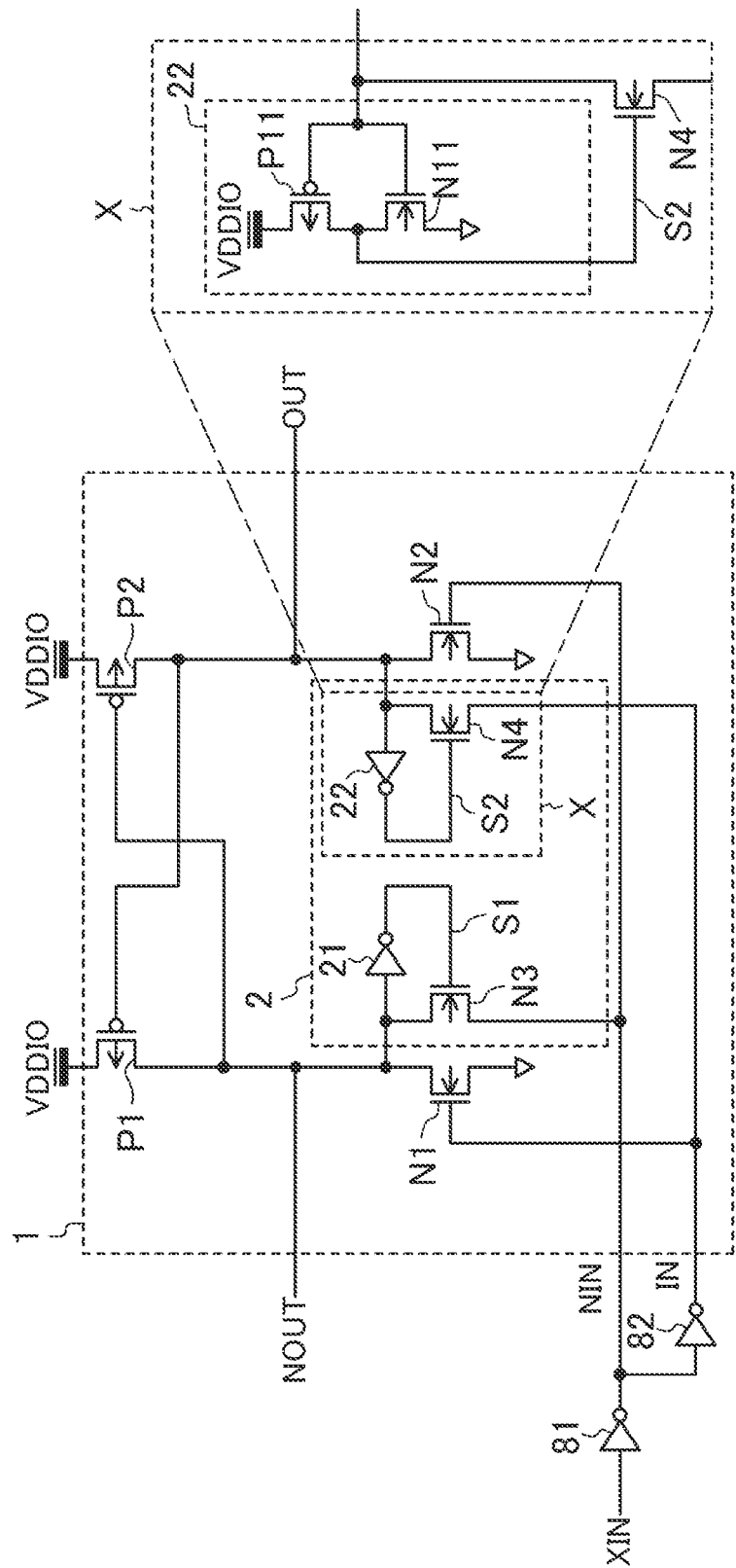
FIG. 1 is a circuit diagram showing a configuration of a level shift circuit according to the first embodiment.

Embodiments of the present disclosure will be described hereinafter. Note that any specific numerical values presented in the following embodiments are mere examples for easy understanding of the invention, and by no means intended to limit the scope of the invention. In the following description, a node of a circuit, a signal passing through the node, and the voltage at the node may be referred to under the same reference character. Also, a power supply itself and the voltage of the power supply may be referred to under the same reference character.

First Embodiment

A level shift circuit 1 receives an input signal IN and an inverted input signal NIN that transition between a first power supply VDD and a ground VSS, and outputs an output signal OUT and an inverted output signal NOUT that transition between a third power supply VDDIO and the ground VSS. In other words, the input signal IN and the inverted input signal NIN are signals having an amplitude of VDD, and the output signal OUT and the inverted output signal NOUT are signals having an amplitude of VDDIO. The first power supply VDD is 0.8 [V] and the third power supply VDDIO is 1.3 [V], for example.

FIG. 1 shows an example of the circuit diagram of the level shift circuit 1 according to the first embodiment.

The level shift circuit 1 includes a basic circuit constituted by first and second n-type transistors N1 and N2 and first and second p-type transistors P1 and P2 and a rise assist circuit 2.

—Basic Circuit—

The first n-type transistor N1 has a gate connected to an input node IN, a source connected to the ground VSS, and a drain connected to an inverted output node NOUT. The gate of the first n-type transistor N1 receives the input signal IN through the input node IN. Note that the ground VSS corresponds to a second power supply. The second power supply is not limited to the ground VSS but may be a power supply of another potential lower than that of the first power supply VDD.

The second n-type transistor N2 has a gate connected to an inverted input node NIN, a source connected to the ground VSS, and a drain connected to an output node OUT. The gate of the second n-type transistor N2 receives the inverted input signal NIN through the inverted input node NIN.

In the illustrated example, the inverted input signal NIN is a signal obtained by inverting an input signal XIN through an inverter 81, and the input signal IN is a signal obtained by inverting the input signal XIN twice through the inverter 81 and an inverter 82. Although not illustrated, the power supply terminal of the inverter 81 is connected to the first power supply VDD and the ground terminal thereof is connected to the ground VSS. Similarly, the power supply terminal of the inverter 82 is connected to the first power supply VDD and the ground terminal thereof is connected to the ground VSS. Note that the inverters 81 and 82 may be omitted in FIG. 1 and instead the input signal IN and the inverted input signal NIN may be generated in a circuit (not shown) preceding the level shift circuit 1 and input into the level shift circuit 1.

The first p-type transistor P1 has a gate connected to the output node OUT, a source connected to the third power supply VDDIO, and a drain connected to the inverted output node NOUT. In other words, the first p-type transistor P1 and the first n-type transistor N1 are serially connected between the third power supply VDDIO and the ground VSS. The third power supply VDDIO is higher in potential than the first power supply VDD.

The second p-type transistor P2 has a gate connected to the inverted output node NOUT, a source connected to the third power supply VDDIO, and a drain connected to the output node OUT. In other words, the second p-type transistor P2 and the second n-type transistor N2 are serially connected between the third power supply VDDIO and the ground VSS.

—Rise Assist Circuit—

The rise assist circuit 2 is a circuit that assists the rise of the output signal OUT or the rise of the inverted output signal NOUT.

In the illustrated example, the rise assist circuit 2 includes third and fourth n-type transistors N3 and N4 and first and second inverters 21 and 22.

The third n-type transistor N3 has a source connected to the inverted input node NIN and a drain connected to the inverted output node NOUT.

The first inverter 21 has an input connected to the inverted output node NOUT and an output connected to the gate of the third n-type transistor N3. Although not illustrated, the first inverter 21 has a circuit configuration similar to that of the second inverter 22 shown in FIG. 1, in which, for example, a p-type transistor and an n-type transistor are serially connected between the third power supply VDDIO and the ground VSS. The output signal of the first inverter 21 is hereinafter denoted by S1.

The fourth n-type transistor N4 has a source connected to the input node IN and a drain connected to the output node OUT.

The second inverter 22 has an input connected to the output node OUT and an output connected to the gate of the fourth n-type transistor N4. In the second inverter 22, for example, a p-type transistor P11 (a high-potential side switching element) and an n-type transistor N11 (a low-potential side switching element) are serially connected between the third power supply VDDIO and the ground VSS. The output signal of the second inverter 22 is hereinafter denoted by S2.

—Operation of Level Shift Circuit—

Next, the operation of the level shift circuit 1 will be described.

<Operation when Input Signal IN Transitions from L to H>

The operation of the level shift circuit 1 when the input signal IN transitions from L to H will be described with reference to FIG. 2A.

Figure 2A:
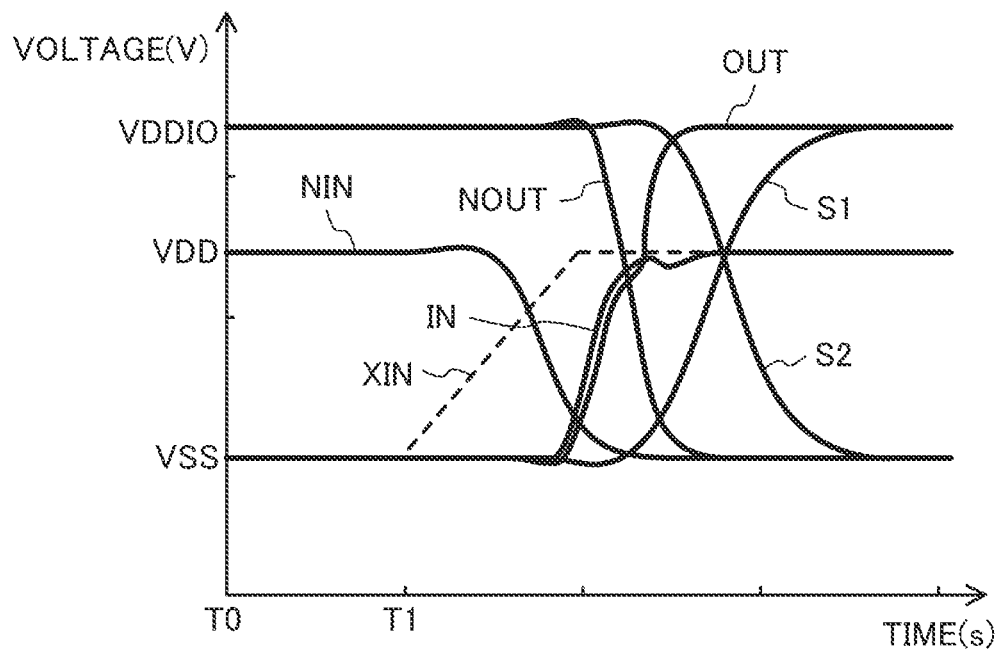
FIG. 2A is a view showing an example of voltage waveforms at nodes of the level shift circuit.

As shown in FIG. 2A, in the initial state (at time T0), the input signal XIN=L, the input signal IN=L, and the inverted input signal NIN=H. Since the second n-type transistor N2 is ON and the second p-type transistor P2 is OFF, the output signal OUT=L. The output signal S2 of the second inverter 22 is H, and thus the fourth n-type transistor N4 is ON.

Also, since the first n-type transistor N1 is OFF and the first p-type transistor P1 is ON, the inverted output signal NOUT=H. The output signal S1 of the first inverter 21 is L, and thus the third n-type transistor N3 is OFF.

At time T1, once the input signal XIN rises, the inverted input signal NIN changes from H to L, and the input signal IN changes from L to H.

With the inverted input signal NIN becoming L, the second n-type transistor N2 turns OFF. Since the fourth n-type transistor N4 is ON in the initial state, charge is supplied from the first power supply VDD to the output node OUT through the fourth n-type transistor N4 in the process of rising of the input signal IN from L to H. This charge supply assists the rising of the output signal OUT whereby the rising of the output signal OUT can be advanced.

Also, with the input signal IN becoming H, the first n-type transistor N1 turns ON, causing the inverted output signal NOUT to start falling. When the inverted output signal NOUT falls, the second p-type transistor P2 turns ON, causing start of charge supply from the third power supply VDDIO to the output node OUT.

Since the second inverter 22 is a circuit operating with the third power supply VDDIO as described above, when the voltage of the output signal OUT rises up to a threshold determined based on the third power supply, the output signal S2 changes from H to L. That is, the second inverter 22 changes from H to L after a lapse of a predetermined delay time. The fourth n-type transistor N4 then turns OFF, terminating the assist operation by the rise assist circuit 2.

Since the second p-type transistor P2 is ON, the output signal OUT finally rises up to the third power supply VDDIO.

As described above, in this embodiment, the termination time of the assist operation can be extended depending on the delay time of the second inverter 22. Specifically, in the example of FIG. 2A, the assist operation of the rise assist circuit 2 continues until the output signal OUT becomes near the first power supply VDD. Since the inverter 82 is a circuit operating with the first power supply VDD, this means that the assist operation has been achieved up to near this power supply voltage. That is, the effectiveness of the assist operation can be further enhanced.

Note that, when the inverted output signal NOUT falls, causing the output signal S1 of the first inverter 21 to become H, the third n-type transistor N3 turns ON. However, since both the inverted input signal NIN and the inverted output signal NOUT are L, i.e., both the source and drain of the third n-type transistor N3 are L, the third n-type transistor N3, though it is ON, will have no influence on the operations of other circuits.

<Operation when Input Signal IN Transitions from H to L>

The operation of the level shift circuit 1 when the input signal IN transitions from H to L will be described with reference to FIG. 2B.

Figure 2B:
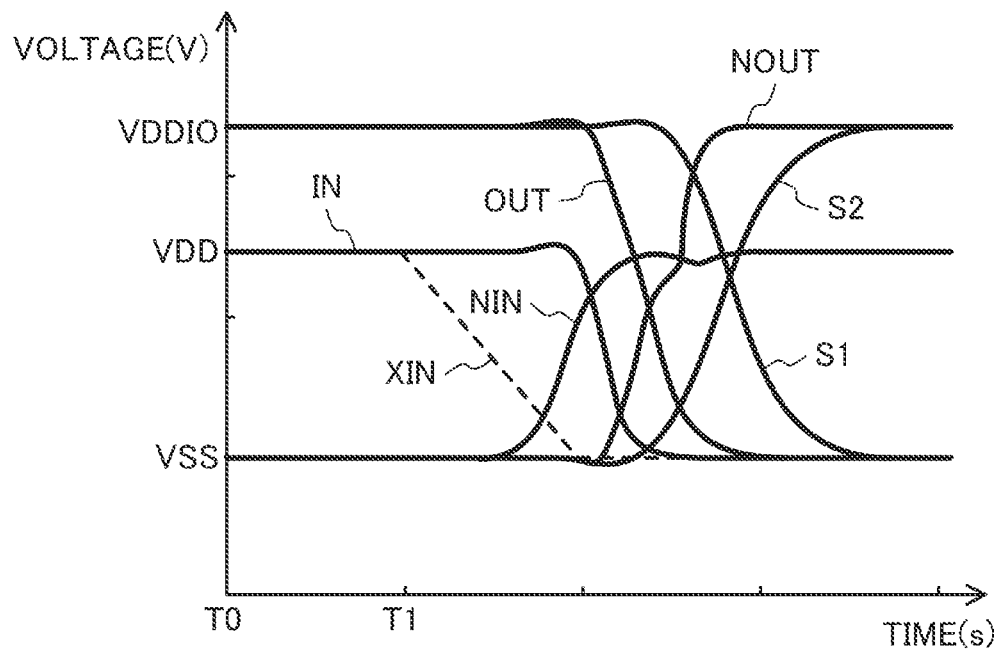
FIG. 2B is a view showing another example of voltage waveforms at nodes of the level shift circuit.

As shown in FIG. 2B, in the initial state (at time T0), the input signal XIN=H, i.e., the input signal IN=H and the inverted input signal NIN=L. Since the second n-type transistor N2 is OFF and the second p-type transistor P2 is ON, the output signal OUT=H. The output signal S2 of the second inverter 22 is L, and thus the fourth n-type transistor N4 is OFF.

Also, since the first n-type transistor N1 is ON and the first p-type transistor P1 is OFF, the inverted output signal NOUT=L. The output signal S1 of the first inverter 21 is H, and thus the third n-type transistor N3 is ON.

At time T1, once the input signal XIN falls, the inverted input signal NIN changes from L to H, and the input signal IN changes from H to L.

With the input signal IN becoming L, the first n-type transistor N1 turns OFF. Since the third n-type transistor N3 is ON in the initial state, charge is supplied from the first power supply VDD to the inverted output node NOUT through the third n-type transistor N3 in the process of rising of the inverted input signal NIN from L to H. This charge supply assists the rising of the inverted output signal NOUT whereby the rising of the inverted output signal NOUT can be advanced.

Also, with the inverted input signal NIN becoming H, the second n-type transistor N2 turns ON, causing the output signal OUT to start falling. When the output signal OUT falls, the first p-type transistor P1 turns ON, causing start of charge supply from the third power supply VDDIO to the inverted output node NOUT.

Since the first inverter 21 is a circuit operating with the third power supply VDDIO as described above, when the voltage of the inverted output signal NOUT rises up to a threshold determined based on the third power supply VDDIO, the output signal S1 changes from H to L. That is, the first inverter 21 changes from H to L after a lapse of a predetermined delay time. The third n-type transistor N3 then turns OFF, terminating the assist operation by the rise assist circuit 2.

As described above, in this embodiment, the termination time of the assist operation can be extended depending on the delay time of the first inverter 21. As a result, in the example of FIG. 2B, for example, the assist operation continues until the inverted output signal NOUT becomes near the first power supply VDD. Since the inverter 81 is a circuit operating with the first power supply VDD, this means that the assist operation has been achieved up to near this power supply voltage. That is, the effectiveness of the assist operation can be further enhanced.

Since the first p-type transistor P1 is ON, the inverted output signal NOUT finally rises up to the third power supply VDDIO.

Note that, when the output signal OUT falls, causing the output signal S2 of the second inverter 22 to become H, the fourth n-type transistor N4 turns ON. However, since both the input signal IN and the output signal OUT are L, i.e., both the source and drain of the fourth n-type transistor N4 are L, the fourth n-type transistor N4, though it is ON, will have no influence on the operations of other circuits.

—Functions and Effects of First Embodiment—

Figure 6:
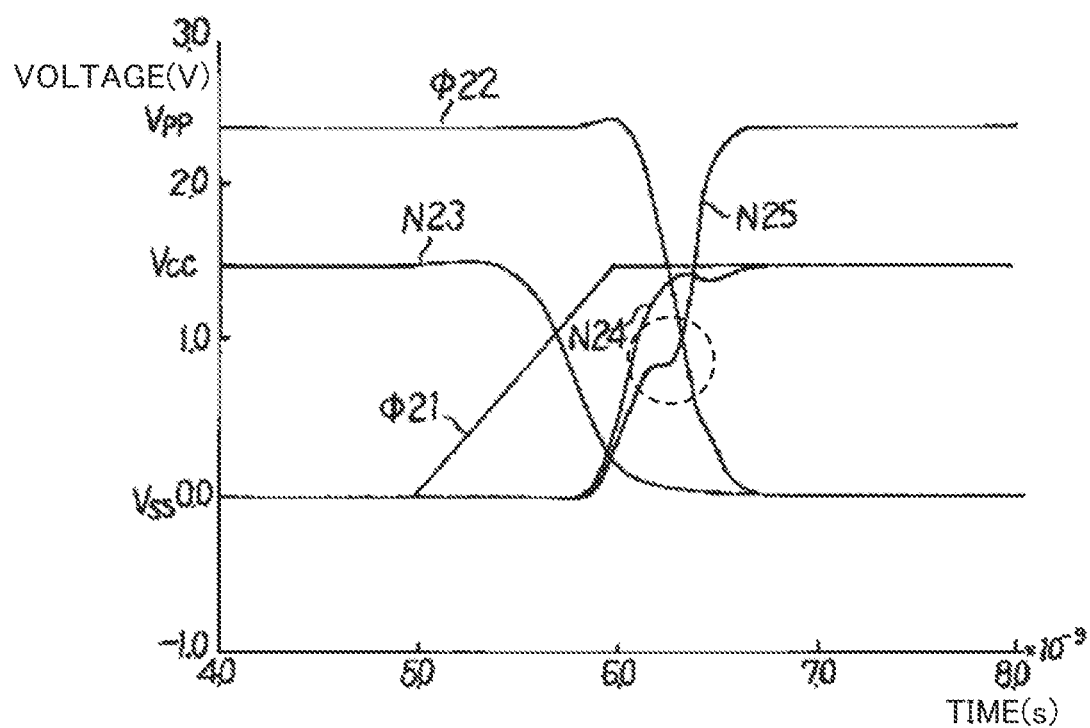
FIG. 6 is a view showing an example of voltage waveforms at nodes of the conventional level shift circuit.

As described above, the technique of the cited patent document (hereinafter simply called the "prior art") has room for improvement because the assist operation is discontinued at a comparatively early stage of the rising of the output signal of the level shift circuit due to the change in the output signal (see FIG. 6).

By contrast, in the level shift circuit 1 of the first embodiment, even when the output state of the output signal OUT changes, it is after a lapse of the delay time of the second inverter 22 from this change that the rise assist circuit 2 stops its operation. The same holds true for the output signal NOUT. In comparison with the prior art, therefore, sufficient assist operation can be obtained.

Also, as described above, in the prior art, there is a case where the transistor 41 and the transistor 42 are OFF simultaneously, causing a problem that the voltage at the node midway between these transistors is boosted at such a time.

By contrast, in this embodiment, unlike the prior art, there is no such place where transistors on both sides of a given node become OFF simultaneously, causing a floating state, in the process of the assist operation of the output signal. Therefore, no problem about boosting of the voltage at a given node will occur. To state more specifically, in this embodiment, the fourth n-type transistor N4 corresponds to the transistor 42 in the prior art, the input node IN corresponds to the node midway between the transistor 41 and the transistor 42, and a p-type transistor (not shown) of the inverter 82 corresponds to the transistor 41 in the prior art. In this embodiment, an n-type transistor of the inverter 82 is also connected to the input node IN that connects the fourth n-type transistor N4 and the p-type transistor of the inverter 82. With the function of this n-type transistor, unlike the prior art, the voltage at the input node IN will not be boosted in accordance with the transition of the input signal, whereby the problem of the prior art is solved.

(Alterations)

Figure 3A:
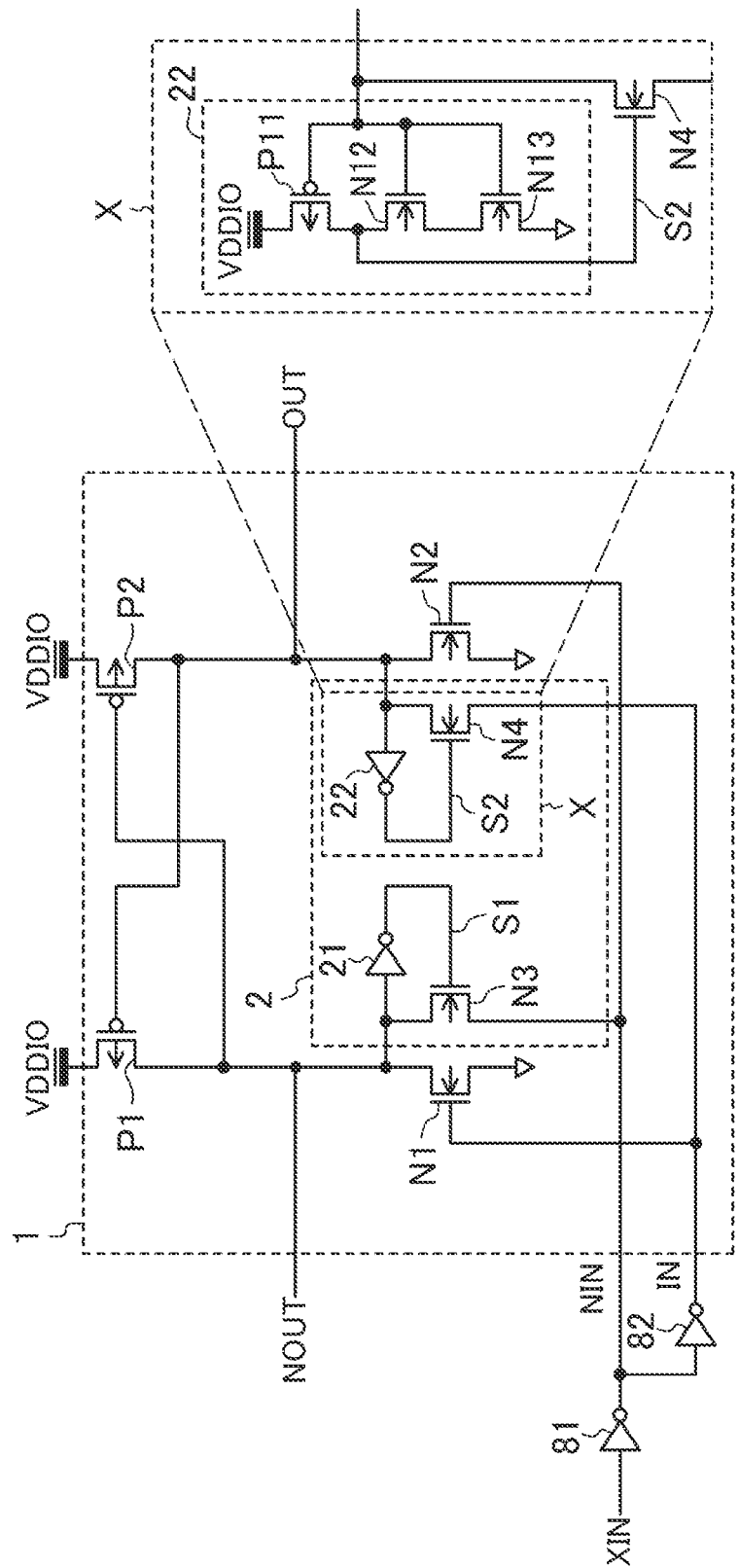
FIG. 3A is a circuit diagram showing an alteration of the level shift circuit according to the first embodiment.
Figure 3B:
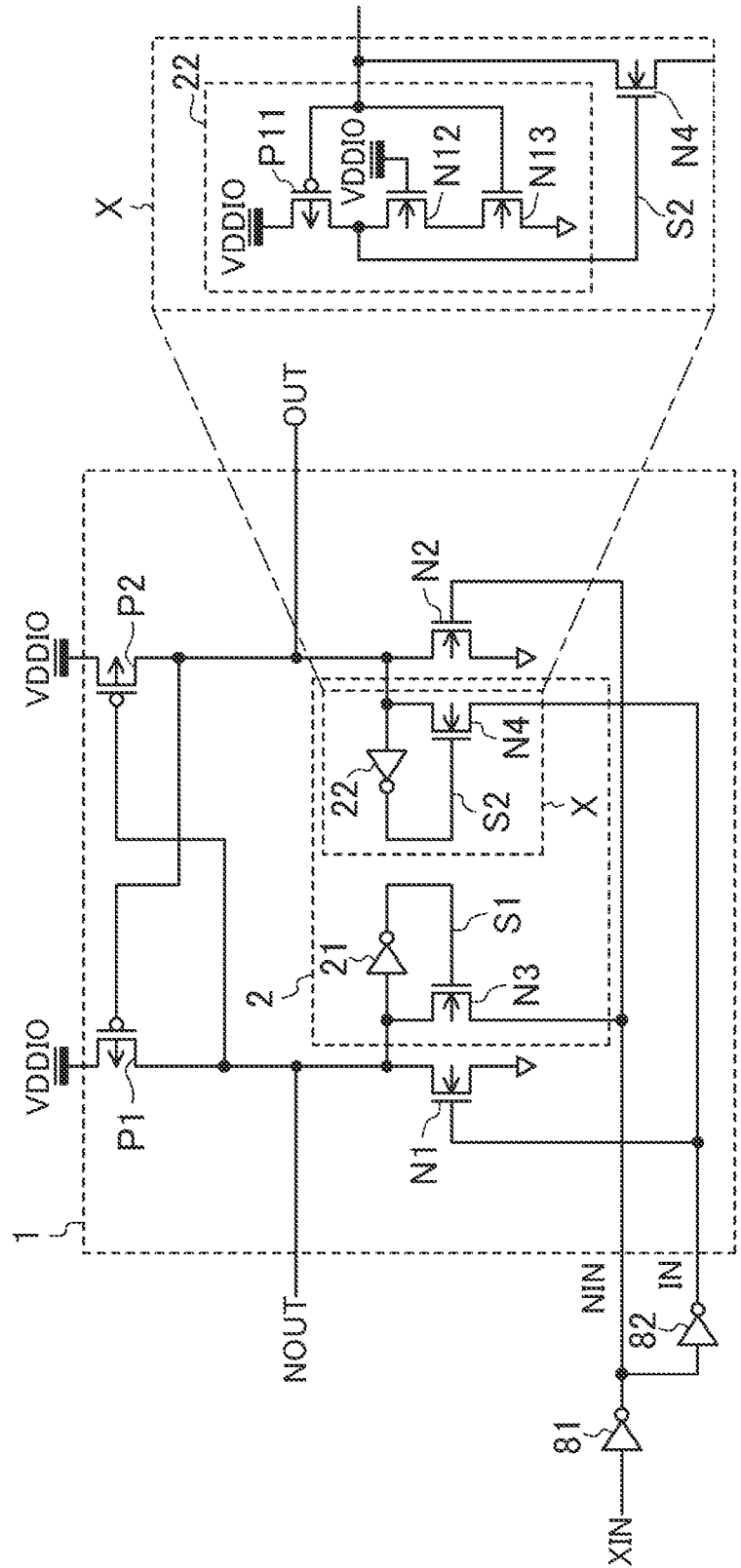
FIG. 3B is a circuit diagram showing another alteration of the level shift circuit according to the first embodiment.

FIGS. 3A and 3B show alterations of the level shift circuit 1 according to the first embodiment. In FIGS. 3A and 3B, components corresponding to those in FIG. 1 are denoted by the same reference characters. These alterations will be described hereinafter focusing mainly on different points from the first embodiment. Basic operations are similar to those of the first embodiment.

These alterations are different from the configuration of FIG. 1 in the circuit configurations of the first inverter 21 and the second inverter 22. Note that, while the circuit configuration of the second inverter 22 is shown in FIGS. 3A and 3B, the first inverter 21 also uses a circuit of the same configuration.

Specifically, in the second inverter 22 of the level shift circuit 1 of each of FIGS. 3A and 3B, the low-potential side switching element has two n-type transistors N12 and N13 serially connected between the node S2 and the ground VSS. In other words, the second inverter 22 has a configuration of the p-type transistor P11 and two n-type transistors N12 and N13 serially connected between the third power supply VDDIO and the ground VSS. The same holds true for the first inverter 21: i.e., the low-potential side switching element has two n-type transistors N12 and N13 serially connected between the node S1 and the ground VSS.

In FIG. 3A, in the second inverter 22, the gates of the n-type transistors N12 and N13 are both connected to the output node OUT. The drain of the n-type transistor N12 is connected to the node S2 and the source thereof is connected to the drain of the n-type transistor N13. The source of the n-type transistor N13 is connected to the ground VSS.

Similarly, in the first inverter 21 in FIG. 3A, the gates of the n-type transistors N12 and N13 are both connected to the inverted output node NOUT. The drain of the n-type transistor N12 is connected to the node S1 and the source thereof is connected to the drain of the n-type transistor N13. The source of the n-type transistor N13 is connected to the ground VSS.

In FIG. 3B, in comparison with FIG. 3A, the difference is that the gate of the n-type transistor N12 is connected to the third power supply VDDIO. The other configuration is the same as that of FIG. 3A. In other words, the low-potential side switching element of the second inverter 22 in FIG. 3B has a configuration in which the n-type transistor N12 having a gate connected to the third power supply VDDIO (corresponding to the seventh n-type transistor) and the n-type transistor N13 having a gate connected to the output node OUT (corresponding to the eighth n-type transistor) are serially connected. Similarly, the low-potential side switching element of the first inverter 21 has a configuration in which the n-type transistor N12 having a gate connected to the third power supply VDDIO (corresponding to the fifth n-type transistor) and the n-type transistor N13 having a gate connected to the inverted output node NOUT (corresponding to the sixth n-type transistor) are serially connected.

In these alterations (FIGS. 3A and 3B), the high-potential side switching element of the second inverter 22 is constituted by the p-type transistor P11 having a gate connected to the output node OUT, a source connected to the third power supply VDDIO, and a drain connected to the node S2, as in FIG. 1. Similarly, the high-potential side switching element of the first inverter 21 is constituted by the p-type transistor P11 having a gate connected to the inverted output node NOUT, a source connected to the third power supply VDDIO, and a drain connected to the node S1.

With the configuration in these alterations, in the low-potential side switching elements of the first inverter 21 and the second inverter 22, the voltage stress applied across the source-drain of a single transistor can be reduced.

A specific example will be described along the "Operation when input signal IN transitions from L to H" described above. When the input signal IN rises from L in the initial state (at time T0) to H, the voltage at the node S2 is boosted due to the gate-source coupling capacitance of the fourth n-type transistor N4. This causes the possibility that an overvoltage may be applied between the node S2 and the ground VSS (e.g., across the source-drain of the low-potential side switching element constituting the second inverter 22). Similarly, in the "Operation when input signal IN transitions from H to L," when the input signal IN falls from H in the initial state (at time T0) to L, the voltage at the node S1 is boosted due to the gate-source coupling capacitance of the third n-type transistor N3. This causes the possibility that an overvoltage may be applied between the node S1 and the ground VSS (e.g., across the source-drain of the low-potential side switching element constituting the first inverter 21).

In view of the above, as in these alterations, by configuring the low-potential side switching element to have two serially-connected n-type transistors, the voltage stress applied to one n-type transistor can be reduced. That is, overvoltage-caused degradation of the n-type transistors can be prevented.

Figure 7:
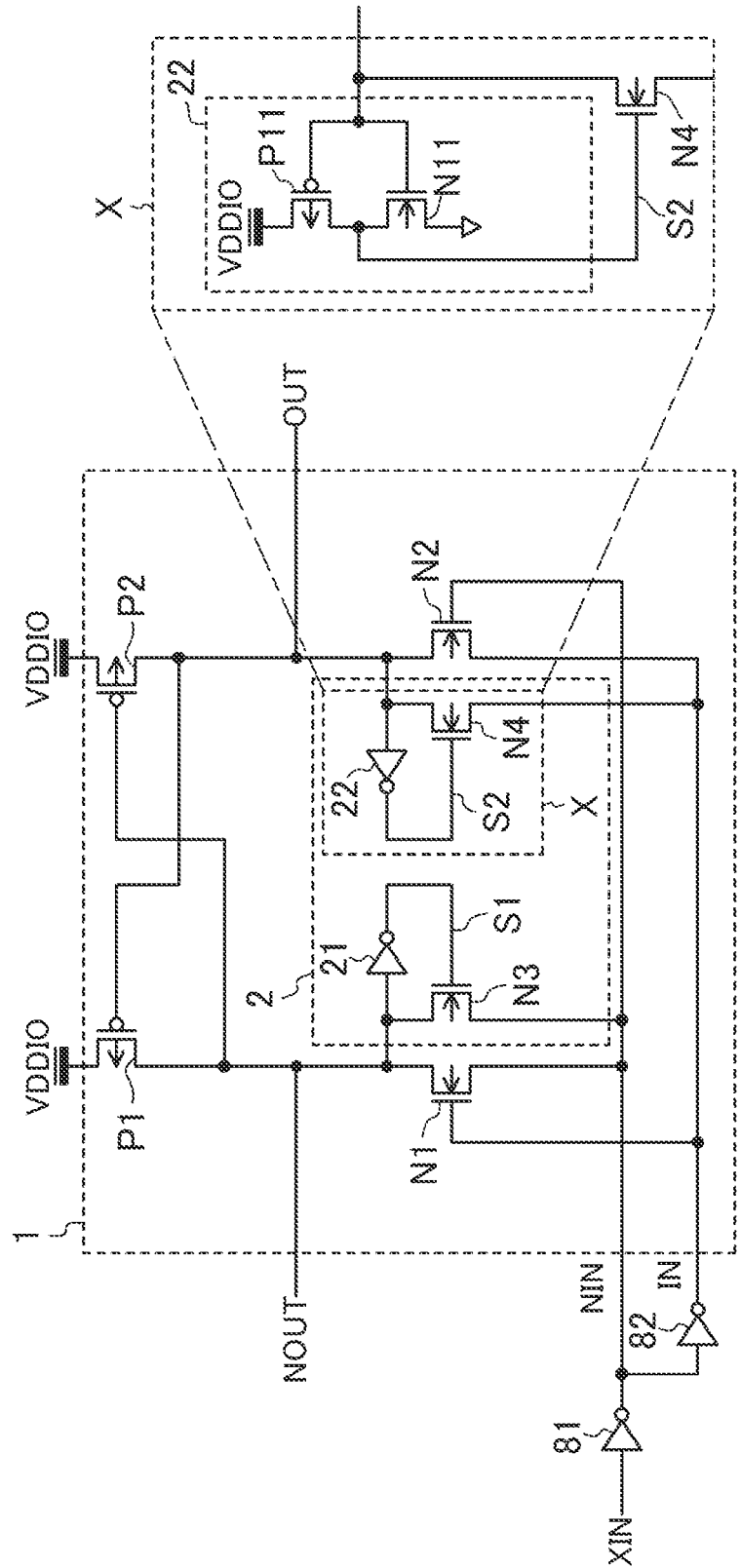
FIG. 7 is a circuit diagram showing yet another alteration of the level shift circuit according to the first embodiment.

In the configurations of FIGS. 1, 3A, and 3B, the source of the first n-type transistor N1 may be connected to the inverted input node NIN, and the source of the second n-type transistor N2 may be connected to the input node IN. FIG. 7 shows this alteration from the configuration of FIG. 1. In this case, also, substantially the same operations as those in the first embodiment and the alterations described above are performed, and similar effects are obtained.

This alteration will be described along the "Operation when input signal IN changes from L to H" in FIG. 7, focusing mainly on an operation related to the different point from the configuration of FIG. 1.

First, in the configuration of FIG. 7, in the initial state, since the inverted input signal NIN is H, the source of the first n-type transistor N1 is H, which is different from the case of FIG. 1. However, since the first n-type transistor N1 is OFF at this time, there is no substantial difference in operation between FIG. 1 and FIG. 7.

Once the input signal XIN rises in FIG. 7, the input signal IN changes from L to H, causing the source of the second n-type transistor N2 to become H, which is different from the case of FIG. 1. However, since the second n-type transistor N2 is OFF at this time, there is no substantial difference from the operation in the above embodiment.

The operations other than the above are similar to those in the above embodiment described above. That is, while some connections are different between FIG. 1 and FIG. 7, there is no substantial difference in operation between them.

The same holds true when the "Operation when input signal IN transitions from H to L" is performed and when changes similar to those in FIG. 7 are applied to the alterations of FIGS. 3A and 3B.

Second Embodiment

Figure 4:
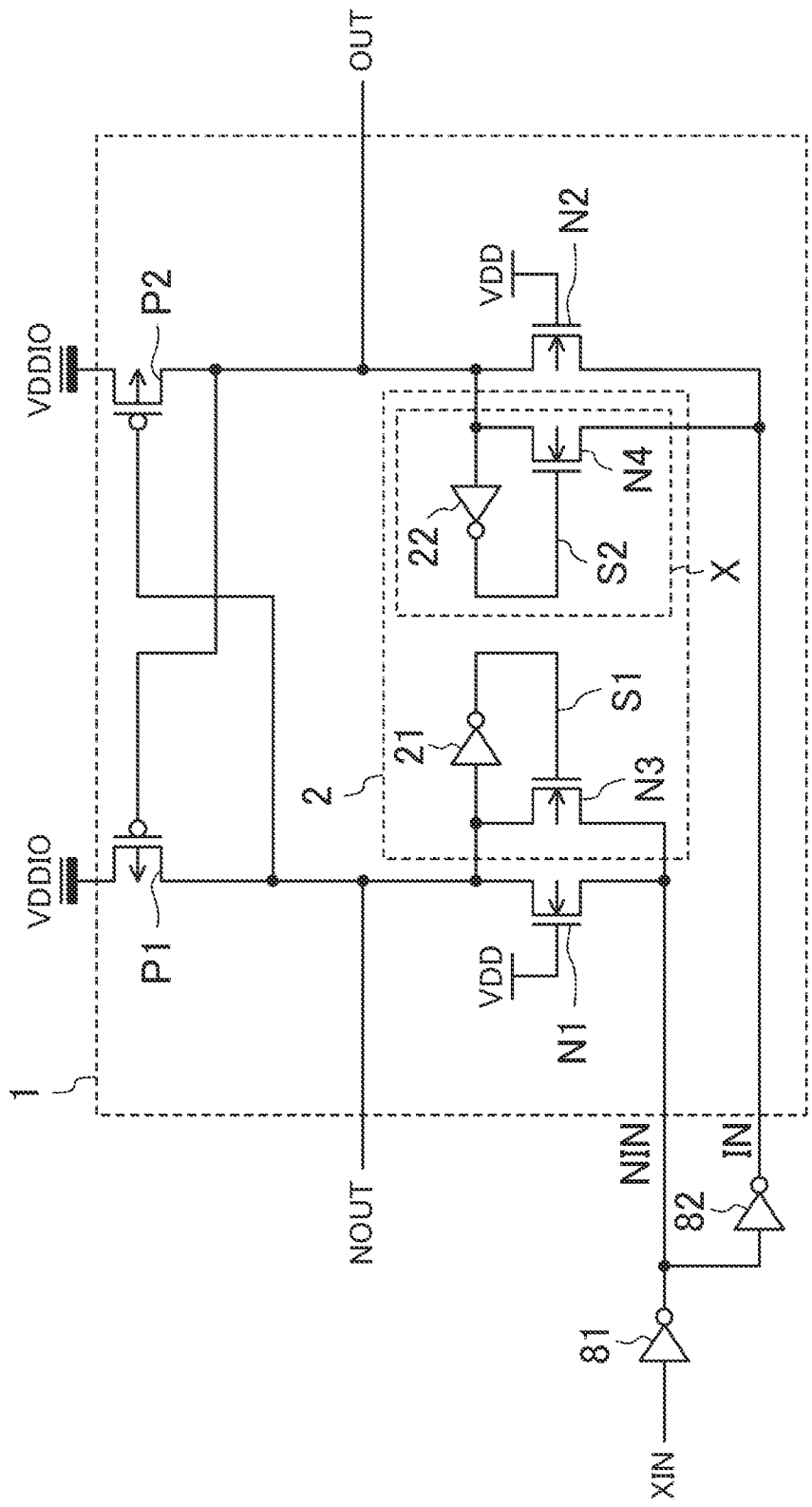
FIG. 4 is a circuit diagram showing a configuration of a level shift circuit according to the second embodiment.

FIG. 4 shows an example of the circuit diagram of a level shift circuit 1 according to the second embodiment. In FIG. 4, components corresponding to those in FIG. 1 are denoted by the same reference characters. This embodiment will be described hereinafter focusing mainly on different points from the first embodiment. Note that, by denoting elements (e.g., transistors and inverters) by the same reference characters, it is not intended to impose a restriction that these elements are identical in design parameters, process parameters, etc. That is, the technical scope of the present disclosure includes configurations in which elements denoted by the same reference characters in FIGS. 1 and 4 have different parameters from each other between FIG. 1 and FIG. 4. The same holds true for the relations between other figures.

The configuration of FIG. 4 is different from the configuration of FIG. 1 in that the gates of the first n-type transistor N1 and the second n-type transistor N2 are connected to the first power supply VDD. Also, the configuration of FIG. 4 is different from the configuration of FIG. 1 in that the source of the first n-type transistor N1 is connected to the inverted input node NIN and the source of the second n-type transistor N2 is connected to the input node IN.

—Operation of Level Shift Circuit—

Next, the operation of the level shift circuit 1 of this embodiment will be described.

<Operation when Input Signal IN Transitions from L to H>

The operation of the level shift circuit 1 when the input signal IN transitions from L to H will be described. The signal waveforms are similar to those in FIG. 2A.

In the initial state (at time T0), the input signal XIN=L, the input signal IN=L, and the inverted input signal NIN=H. Since VDD is applied to the gates of the first n-type transistor N1 and the second n-type transistor N2, the inverted output signal NOUT=H and the output signal OUT=L. Therefore, the output signal S1 of the first inverter 21 is L, and thus the third n-type transistor N3 is OFF. Also, the output signal S2 of the second inverter 22 is H, and thus the fourth n-type transistor N4 is ON.

At time T1, once the input signal XIN rises, the input signal IN starts rising from L to H. The gate-source voltage of the second n-type transistor N2 in the initial state is VDD. Therefore, in the process of rising of the input signal IN, charge is supplied from the first power supply VDD to the output node OUT through the second n-type transistor N2 until the output signal OUT becomes VDD–Vt (Vt is the threshold voltage of N2). Moreover, since the fourth n-type transistor N4 remains ON, charge is supplied from the first power supply VDD to the output node OUT through the fourth n-type transistor N4. This charge supply through the second n-type transistor N2 and the fourth n-type transistor N4 assists the rising of the output signal OUT whereby the rising can be advanced.

Also, when the inverted input signal NIN becomes L, the inverted output signal NOUT starts falling through the first n-type transistor N1. When the inverted output signal NOUT falls, the second p-type transistor P2 turns ON, causing start of charge supply from the third power supply VDDIO to the output node OUT.

Since the second inverter 22 is a circuit operating with the third power supply VDDIO, when the voltage of the output signal OUT rises up to a threshold determined based on the third power supply VDDIO, the output signal S2 changes from H to L. That is, the second inverter 22 changes from H to L after a lapse of a predetermined delay time. The fourth n-type transistor N4 then turns OFF, terminating the assist operation by the rise assist circuit 2.

Since the second p-type transistor P2 is ON, the output signal OUT finally rises up to the third power supply VDDIO.

As described above, in this embodiment, as in the first embodiment, the termination time of the assist operation can be extended depending on the delay time of the second inverter 22.

Note that, when the inverted output signal NOUT falls, causing the output signal S1 of the first inverter 21 to become H, the third n-type transistor N3 turns ON. However, since both the inverted input signal NIN and the inverted output signal NOUT are L, i.e., both the source and drain of the third n-type transistor N3 are L, the third n-type transistor N3, though it is ON, will have no influence on the operations of other circuits.

<Operation when Input Signal IN Transitions from H to L>

The operation of the level shift circuit 1 when the input signal IN transitions from H to L will be described. The signal waveforms are similar to those in FIG. 2B.

In the initial state (at time T0), the input signal XIN=H, the input signal IN=H, and the inverted input signal NIN=L. Since VDD is applied to the gates of the first n-type transistor N1 and the second n-type transistor N2, the inverted output signal NOUT=L and the output signal OUT=H. Therefore, the output signal S1 of the first inverter 21 is H, and thus the third n-type transistor N3 is ON. Also, the output signal S2 of the second inverter 22 is L, and thus the fourth n-type transistor N4 is OFF.

At time T1, once the input signal XIN falls, the inverted input signal NIN starts rising from L to H. The gate-source voltage of the first n-type transistor N1 in the initial state is VDD. Therefore, in the process of rising of the inverted input signal NIN, charge is supplied from the first power supply VDD to the inverted output node NOUT through the first n-type transistor N1 until the inverted output signal NOUT becomes VDD–Vt (Vt is the threshold voltage of N1). Moreover, since the third n-type transistor N3 remains ON, charge is supplied from the first power supply VDD to the inverted output node NOUT through the third n-type transistor N3. This charge supply through the first n-type transistor N1 and the third n-type transistor N3 assists the rising of the inverted output signal NOUT whereby the rising can be advanced.

Also, when the input signal IN becomes L, the output signal OUT starts falling through the second n-type transistor N2. When the output signal OUT falls, the first p-type transistor P1 turns ON, causing start of charge supply from the third power supply VDDIO to the inverted output node NOUT.

Since the first inverter 21 is a circuit operating with the third power supply VDDIO, when the voltage of the inverted output signal NOUT rises up to a threshold determined based on the third power supply VDDIO, the output signal S1 changes from H to L. That is, the first inverter 21 changes from H to L after a lapse of a predetermined delay time. The third n-type transistor N3 then turns OFF, terminating the assist operation by the rise assist circuit 2.

Since the first p-type transistor P1 is ON, the inverted output signal NOUT finally rises up to the third power supply VDDIO.

As described above, in this embodiment, as in the first embodiment, the termination time of the assist operation can be extended depending on the delay time of the inverter 21, 22.

Note that, when the output signal OUT falls, causing the output signal S2 of the second inverter 22 to become H, the fourth n-type transistor N4 turns ON. However, since both the input signal IN and the output signal OUT are L, i.e., both the source and drain of the fourth n-type transistor N4 are L, the fourth n-type transistor N4, though it is ON, will have no influence on the operations of other circuits.

—Functions and Effects of Second Embodiment—

As described above, in the level shift circuit 1 of the second embodiment, as in the first embodiment, even when the output state of the output signal OUT changes, it is after a lapse of the delay time of the second inverter 22 from this change that the rise assist circuit 2 stops its operation. The same holds true for the output signal NOUT. In comparison with the prior art, therefore, sufficient assist operation can be obtained. Also, as in the first embodiment, there is no such place where transistors on both sides of a given node become OFF simultaneously, causing a floating state, in the process of the assist operation. Therefore, no problem about boosting of the voltage at a given node will occur.

Moreover, in this embodiment, the gates of the first and second n-type transistors N1 and N2 are connected to the first power supply VDD, the source of the first n-type transistor N1 is connected to the inverted input node NIN, and the source of the second n-type transistor N2 is connected to the input node IN. Therefore, in each of the first and second n-type transistors N1 and N2, the voltage applied across the source/drain/gate can be reduced in comparison with the case of the first embodiment. Specifically, in the first embodiment, there can be a case where, in the first n-type transistor N1, the gate voltage is VSS, the source voltage is VSS, and the drain voltage is VDDIO, for example. In this case, the source-drain voltage is VDDIO. By contrast, in the second embodiment, in the first n-type transistor N1 or the second n-type transistor N2, when the drain voltage is VDDIO, the gate voltage and the source voltage are VDD. The source-drain voltage is therefore VDDIO–VDD, which is low in comparison with that in the first embodiment. In this embodiment, therefore, since a transistor with a low breakdown voltage but high speed can be used as the first n-type transistor N1, the circuit operation can be sped up in comparison with the first embodiment.

(Alteration 1)

Figure 5:
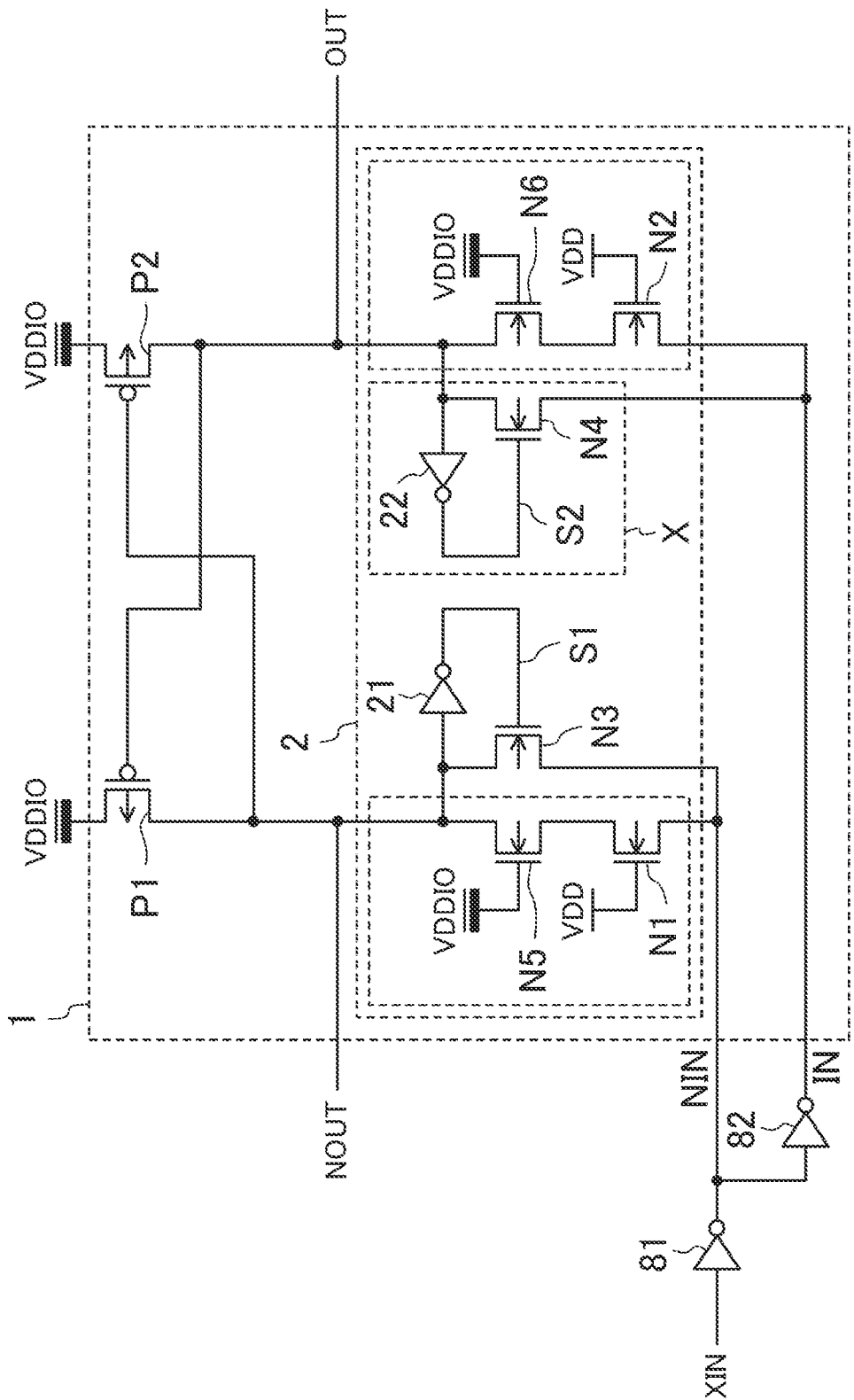
FIG. 5 is a circuit diagram showing an alteration of the level shift circuit according to the second embodiment.

FIG. 5 shows an alteration of the level shift circuit 1 according to the second embodiment. In FIG. 5, components corresponding to those in FIG. 4 are denoted by the same reference characters. This alteration will be described hereinafter focusing mainly on different points from the second embodiment. Basic operations are similar to those of the second embodiment.

This alteration is different from the configuration of FIG. 4 in that a fifth n-type transistor N5 is provided between the inverted output node NOUT and the first n-type transistor N1, and a sixth n-type transistor N6 is provided between the output node OUT and the second n-type transistor N2.

Specifically, the fifth n-type transistor N5 has a gate connected to the third power supply VDDIO and a source connected to the drain of the first n-type transistor N1. The drain of the fifth n-type transistor N5 is connected to the inverted output node NOUT, the input of the first inverter 21, and the drain of the third n-type transistor N3.

The sixth n-type transistor N6 has a gate connected to the third power supply VDDIO and a source connected to the drain of the second n-type transistor N2. The drain of the sixth n-type transistor N6 is connected to the output node OUT, the input of the second inverter 22, and the drain of the fourth n-type transistor N4.

According to this alteration, the maximum value of the source voltage of the fifth n-type transistor N5, i.e., the drain voltage of the first n-type transistor N1 can be VDDIO–Vt (Vt is the threshold voltage of the fifth n-type transistor N5). The same holds true for the drain voltage of the second n-type transistor N2. It is therefore possible to reduce the potential difference between the source and drain of each of the first and second n-type transistors N1 and N2, and thus transistors low in breakdown voltage can be used as the first and second n-type transistors N1 and N2.

The embodiments and the alterations described above can be combined together appropriately. For example, in FIGS. 4 and 5, as the first inverter 21 and the second inverter 22, the configuration shown in FIG. 3A may be used, or the configuration shown in FIG. 3B may be used, in place of the configuration shown in FIG. 1. In this case, also, effects similar to those obtained in the first embodiment can be obtained.

Specifically, in the configurations of FIGS. 4 and 5, the circuit shown in X of FIG. 3A may be adopted, so that the low-potential side switching element of the first inverter 21 may have a configuration in which two n-type transistors each having a gate connected to the inverted output node NOUT are serially connected. Also, the low-potential side switching element of the second inverter 22 may have a configuration in which two n-type transistors each having a gate connected to the output node OUT are serially connected.

Similarly, in the configurations of FIGS. 4 and 5, the circuit shown in X of FIG. 3B may be adopted, so that the low-potential side switching element of the first inverter 21 may have a configuration in which an n-type transistor having a gate connected to the third power supply VDDIO (corresponding to the fifth n-type transistor) and an n-type transistor having a gate connected to the inverted output node NOUT (corresponding to the sixth n-type transistor) are serially connected. Also, the low-potential side switching element of the second inverter 22 may have a configuration in which an n-type transistor having a gate connected to the third power supply VDDIO (corresponding to the seventh n-type transistor) and an n-type transistor having a gate connected to the output node OUT (corresponding to the eighth n-type transistor) are serially connected.

(Alteration 2)

Figure 8:
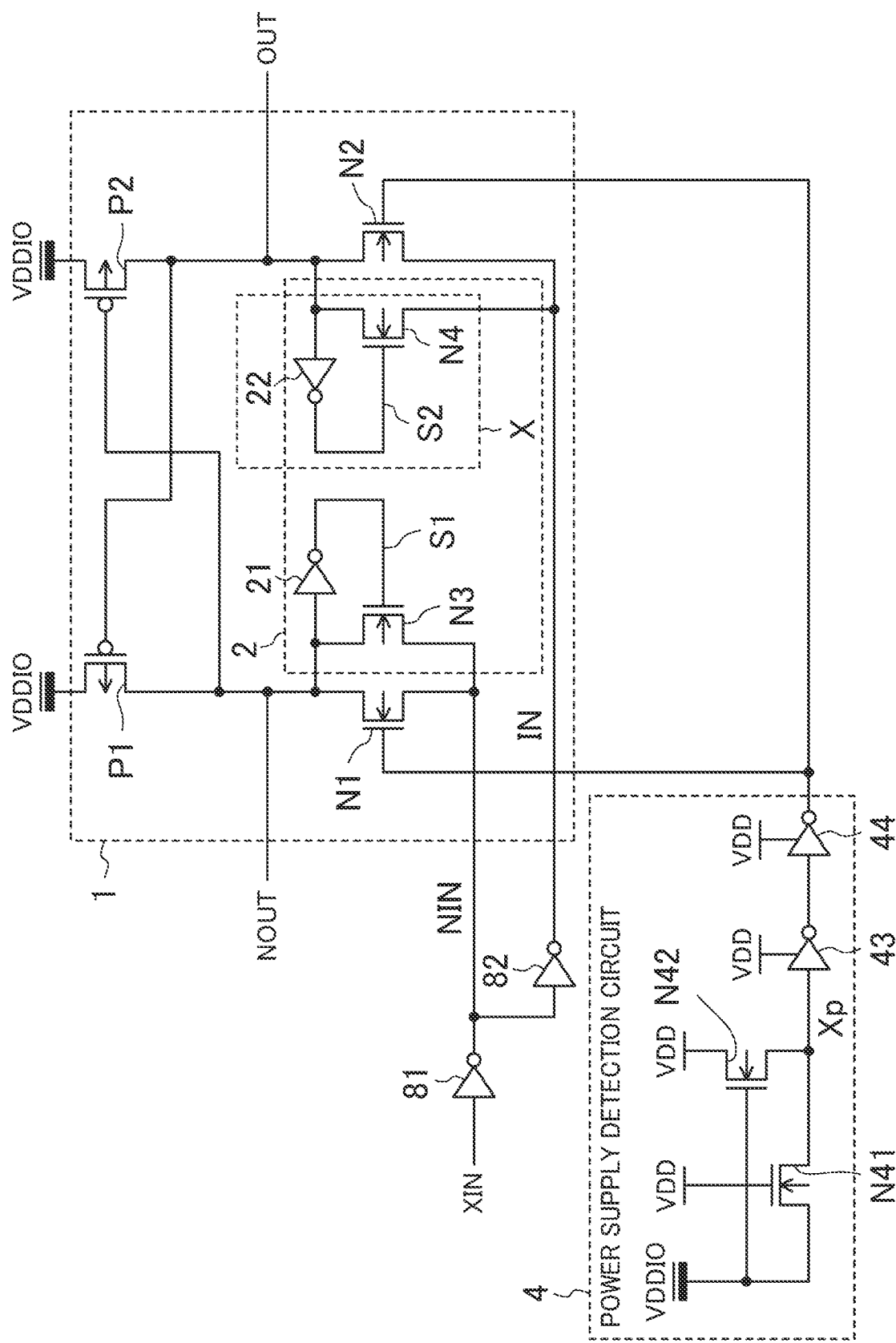
FIG. 8 is a circuit diagram showing another alteration of the level shift circuit according to the second embodiment.

FIG. 8 shows another alteration of the level shift circuit 1 according to the second embodiment. In FIG. 8, components corresponding to those in FIG. 4 are denoted by the same reference characters. This alteration will be described hereinafter focusing mainly on different points from the second embodiment. Basic operations are similar to those of the second embodiment.

In FIG. 8, a power supply detection circuit 4 is provided in addition to the configuration of FIG. 4. The power supply detection circuit 4 includes two n-type transistors N41 and N42 and two inverters 43 and 44.

The n-type transistor N41 is provided between the third power supply VDDIO and a node Xp, and has a gate connected to the first power supply VDD. The n-type transistor N42 has a gate connected to the third power supply VDDIO, a source connected to the node Xp, and a drain connected to the first power supply VDD. The inverters 43 and 44 are serially connected between the node Xp and the output of the power supply detection circuit 4. Although not shown, the inverters 43 and 44 each have a power supply terminal connected to the first power supply VDD and a ground terminal connected to the ground VSS.

In this alteration, in place of the first power supply VDD, the output of the power supply detection circuit 4 is connected to the gates of the first n-type transistor N1 and the second n-type transistor N2. In other words, the gates of the first n-type transistor N1 and the second n-type transistor N2 are connected to the first power supply VDD through the power supply detection circuit 4.

The power supply detection circuit 4 outputs the first power supply VDD when both the first power supply VDD and the third power supply VDDIO are ON, and the output becomes the ground VSS when the first power supply VDD is ON and the third power supply VDDIO is OFF.

Specifically, (1) in the case of both the first power supply VDD and the third power supply VDDIO being ON, when VDDIO−Vt2<VDD (Vt2 is the threshold voltage of the n-type transistor N42), the voltage Xp at the node Xp is VDDIO−Vt2 by the function of the n-type transistor N42. Similarly, (2) in the case of both the first power supply VDD and the third power supply VDDIO being ON, when VDDIO−Vt2>VDD, the voltage Xp at the node Xp is VDD. In whichever case, (1) or (2), the input of the inverter 43 is H, and therefore the output of the inverter 44 is also H. That is, the first power supply VDD is supplied from the power supply detection circuit 4 to the gates of the first n-type transistor N1 and the second n-type transistor N2.

When the first power supply VDD is ON and the third power supply VDDIO is OFF (VDDIO=VSS), in which the n-type transistor N41 is ON and the n-type transistor N42 is OFF, the voltage Xp at the node Xp is VSS. In this case, the input of the inverter 43 is L, and therefore the output of the inverter 44 is also L. That is, the ground VSS is supplied from the power supply detection circuit 4 to the gates of the first n-type transistor N1 and the second n-type transistor N2.

Having the above configuration, it is ensured that there will be no place where a flow-through current flows in the level shift circuit 1 whichever power supply, the first power supply VDD or the third power supply VDDIO, rises first.

The level shift circuit according to the present disclosure is very useful since it can further enhance the effectiveness of the assist operation and also ease the voltage stress to transistors.

What is claimed is:

1. A level shift circuit, comprising:
an input node receiving an input signal transitioning between a first power supply and a second power supply lower in potential than the first power supply;
an inverted input node receiving an inverted input signal inverted from the input signal;
a first n-type transistor having a gate connected to the input node, a source connected to the second power supply or the inverted input node, and a drain connected to an inverted output node;
a first p-type transistor having a drain connected to the inverted output node, a source connected to a third power supply higher in potential than the first power supply, and a gate connected to an output node;
a second n-type transistor having a gate connected to the inverted input node, a source connected to the second power supply or the input node, and a drain connected to the output node;
a second p-type transistor having a drain connected to the output node, a source connected to the third power supply, and a gate connected to the inverted output node;
a third n-type transistor having a source connected to the inverted input node and a drain connected to the inverted output node;
a first inverter having an input connected to the inverted output node and an output connected to a gate of the third n-type transistor;
a fourth n-type transistor having a source connected to the input node and a drain connected to the output node; and
a second inverter having an input connected to the output node and an output connected to a gate of the fourth n-type transistor.

2. The level shift circuit of claim 1, wherein
a low-potential side switching element of the first inverter is constituted by serial connection of two n-type transistors each having a gate connected to the inverted output node, and
a low-potential side switching element of the second inverter is constituted by serial connection of two n-type transistors each having a gate connected to the output node.

3. The level shift circuit of claim 1, wherein
a low-potential side switching element of the first inverter is constituted by serial connection of a fifth n-type transistor having a gate connected to the third power supply and a sixth n-type transistor having a gate connected to the inverted output node, and
a low-potential side switching element of the second inverter is constituted by serial connection of a seventh n-type transistor having a gate connected to the third power supply and an eighth n-type transistor having a gate connected to the output node.

4. A level shift circuit, comprising:
an input node receiving an input signal transitioning between a first power supply and a second power supply lower in potential than the first power supply;
an inverted input node receiving an inverted input signal inverted from the input signal;
a first n-type transistor having a source connected to the inverted input node, a gate connected to the first power supply, and a drain connected to an inverted output node;
a first p-type transistor having a drain connected to the inverted output node, a source connected to a third power supply higher in potential than the first power supply, and a gate connected to an output node;
a second n-type transistor having a source connected to the input node, a gate connected to the first power supply, and a drain connected to the output node;
a second p-type transistor having a drain connected to the output node, a source connected to the third power supply, and a gate connected to the inverted output node;

a third n-type transistor having a source connected to the inverted input node and a drain connected to the inverted output node;
a first inverter having an input connected to the inverted output node and an output connected to a gate of the third n-type transistor;
a fourth n-type transistor having a source connected to the input node and a drain connected to the output node; and
a second inverter having an input connected to the output node and an output connected to a gate of the fourth n-type transistor.

5. The level shift circuit of claim 4, wherein
a low-potential side switching element of the first inverter is constituted by serial connection of two n-type transistors each having a gate connected to the inverted output node, and
a low-potential side switching element of the second inverter is constituted by serial connection of two n-type transistors each having a gate connected to the output node.

6. The level shift circuit of claim 4, wherein
a low-potential side switching element of the first inverter is constituted by serial connection of a fifth n-type transistor having a gate connected to the third power supply and a sixth n-type transistor having a gate connected to the inverted output node, and
a low-potential side switching element of the second inverter is constituted by serial connection of a seventh n-type transistor having a gate connected to the third power supply and an eighth n-type transistor having a gate connected to the output node.

7. A level shift circuit, comprising:
an input node receiving an input signal transitioning between a first power supply and a second power supply lower in potential than the first power supply;
an inverted input node receiving an inverted input signal inverted from the input signal;
a first n-type transistor having a source connected to the inverted input node and a gate connected to the first power supply;
a first p-type transistor having a drain connected to an inverted output node, a source connected to a third power supply higher in potential than the first power supply, and a gate connected to an output node;
a second n-type transistor having a source connected to the input node and a gate connected to the first power supply;
a second p-type transistor having a drain connected to the output node, a source connected to the third power supply, and a gate connected to the inverted output node;
a third n-type transistor having a source connected to the inverted input node and a drain connected to the inverted output node;
a first inverter having an input connected to the inverted output node and an output connected to a gate of the third n-type transistor;
a fourth n-type transistor having a source connected to the input node and a drain connected to the output node;
a second inverter having an input connected to the output node and an output connected to a gate of the fourth n-type transistor;
a fifth n-type transistor having a gate connected to the third power supply, a source connected to a drain of the first n-type transistor, and a drain connected to the inverted output node; and
a sixth n-type transistor having a gate connected to the third power supply, a source connected to a drain of the second n-type transistor, and a drain connected to the output node.

8. The level shift circuit of claim 7, wherein
a low-potential side switching element of the first inverter is constituted by serial connection of two n-type transistors each having a gate connected to the inverted output node, and
a low-potential side switching element of the second inverter is constituted by serial connection of two n-type transistors each having a gate connected to the output node.

9. The level shift circuit of claim 7, wherein
a low-potential side switching element of the first inverter is constituted by serial connection of a seventh n-type transistor having a gate connected to the third power supply and an eighth n-type transistor having a gate connected to the inverted output node, and
a low-potential side switching element of the second inverter is constituted by serial connection of a ninth n-type transistor having a gate connected to the third power supply and a tenth n-type transistor having a gate connected to the output node.

10. The level shift circuit of claim 4, further comprising
a power supply detection circuit that outputs the first power supply when both the first power supply and the third power supply are ON, and outputs the second power supply when the first power supply is ON and the third power supply is OFF,
wherein
the gate of the first n-type transistor and the gate of the second n-type transistor are connected to the first power supply through the power supply detection circuit.

* * * * *